United States Patent

Dao

[11] Patent Number: 5,881,125
[45] Date of Patent: Mar. 9, 1999

[54] ATTENUATED PHASE-SHIFTED RETICLE USING SUB-RESOLUTION PATTERN

[75] Inventor: Giang T. Dao, Fremont, Calif.

[73] Assignee: Intel Corporation, Santa Clara, Calif.

[21] Appl. No.: 952,061

[22] Filed: Sep. 25, 1992

[51] Int. Cl.$^6$ ................................. G03F 7/20; B05D 3/06
[52] U.S. Cl. ........................................... 378/35; 250/492.2
[58] Field of Search ............................. 250/505.1, 492.1, 250/492.2; 355/125, 53, 71, 74; 356/400, 401; 378/34, 35

[56] References Cited

U.S. PATENT DOCUMENTS

| | | | |
|---|---|---|---|
| 4,231,811 | 11/1980 | Somekh et al. | 148/1.5 |
| 4,881,257 | 11/1989 | Nakagawa . | |
| 4,890,309 | 12/1989 | Smith et al. | 378/35 |
| 5,049,925 | 9/1991 | Aiton et al. . | |
| 5,135,609 | 8/1992 | Pease et al. | 156/654 |
| 5,503,959 | 4/1996 | Langston | 250/492.2 |

OTHER PUBLICATIONS

Lin, Burn J. "The Attenuated Phase–Shifting Mask" *Solid State Technology* Jan. 1992 p. 43, pp. 45–47.
N. Hasegawa, A. Imai, T. Terasawa, T. Tanaka, F. Murai. *The Japan Society of Applied Physics and Related Societies* "Extended Abstracts 29p–ZC–3, Submicron Lithography Using Phase Mask (9): Halftone Phase Shifting Mask"1991.

*Primary Examiner*—Safet Metjahic
*Assistant Examiner*—Michael Dalakis
*Attorney, Agent, or Firm*—Blakely, Sokoloff, Taylor & Zafman LLP

[57] ABSTRACT

An attenuated phase-shifted reticle. The disclosed reticle comprises a sub-resolution pattern, in regions other than the features to be formed. The sub-resolution pattern transmits a substantially uniform, attenuated radiation intensity. The features are phase-shifted relative to the sub-resolution pattern, such that light transmitted through them is approximately 180° out of phase compared with the attenuated radiation transmitted through the sub-resolution pattern surrounding the features. In this way, the sub-resolution pattern acts as a phase-shifter for the features.

29 Claims, 7 Drawing Sheets

ATTENUATED PHASE-SHIFTED RETICLE
USING SUB-RESOLUTION PATTERN

FIELD OF INVENTION

The present invention relates to reticles used in patterning radiation sensitive layers and more specifically to a reticle using attenuated phase shifting.

BACKGROUND OF INVENTION

In the semiconductor industry, there is a continuing effort to increase device density by scaling device size. State of the art devices currently have device features with a dimension well below 1 micron (submicron). To form these features, a photosensitive layer is formed on a substrate or device layer, and is exposed to radiation through a reticle. The reticle typically comprises a substantially transparent base material with an opaque layer having the desired pattern formed thereon, as is well known. At the submicron level, diffraction effects become significant, resulting in exposure of portions of the photoresist layer underlying the opaque layer near the edges of features.

To minimize effects of diffraction, phase-shifted reticles have been used in the prior art. Typically, a phase-shifted reticle has an opening in the opaque layer corresponding to the pattern to be formed. Phase-shifters, which transmit the exposing radiation and shift the phase of the radiation approximately 180° relative to the openings, lie along or near the outer edges of the features. The radiation transmitted through the phase-shifter destructively interferes with radiation from the opening, thereby reducing the intensity of radiation incident on the photoresist surface underlying the opaque layer near a feature edge.

Prior art phase-shifted reticles have a number of problems which limit their ability to be used to pattern some features, however. Often, it is desired to place two features in close proximity to one another. For example, contact or via openings may be placed in a closely spaced array. In prior art phase-shifted reticles, each opening has a phase-shifting rim surrounding it. In the case of contact openings in an array, the phase-shifting rims of two openings may be very close to one another. In this case, the phase-shifting rims of the two close opening patterns are roughly equivalent to one very wide rim. Unfortunately, as the phase-shifting rim width is increased, the intensity of radiation underneath the phase-shifting rims increases. The increased intensity causes a deep recession in the developed photoresist layer, and may in fact cause a portion of the photoresist to be removed between two openings. This proximity effect occurs if two phase-shifting rims are positioned at approximately 0.55 λ/NA or less, where K is the wavelength of the exposing radiation, and NA is the numerical aperture of the lens of the lithographic printer being used.

In addition to the above-described proximity effect, phase-shifted reticles may be difficult to produce for certain features. During the fabrication of the reticle, the phase-shifter may be fabricated using a separate masking step from its associated feature. For very small features, the alignment tolerance may be beyond the capability of the process. In addition, even if the phase-shifter can be produced, inspection and repair is often very difficult. Finally, physical limitations may prevent the use of phase-shifters for some types of features. Generally, the phase-shifter must have a width equal to approximately 0.1–4.4 IRF-λ/NA, where IRF is the image reduction factor of the lens. On a 1:1 basis, the width of the phase-shifters are typically approximately $0.1\mu$. Because phase-shifters have this finite width, not all device patterns can be fabricated with phase-shifted reticles, as portions of a feature or two individual features may be spaced too closely together to allow for placement of the phase-shifters in the appropriate regions.

To overcome these problems, an attenuated phase-shifted mask (APSM) has been proposed. The APSM replaces the opaque layer of prior art masks (which is typically a layer of chrome about $0.1\mu$ thick) with a "leaky" layer which transmits a reduced or attenuated percentage of the radiation incident thereon. For example, a very thin layer of chrome (approximately 300 Å) could be used as the leaky layer. A chrome layer this thin will transmit approximately 10% of the radiation incident on the reticle. Additionally, the leaky chrome layer shifts the phase of the transmitted radiation approximately 30° compared to radiation transmitted through regions of the reticle where the leaky chrome layer is not present. In order to achieve the required 180° shift, the features are phase-shifted an additional 150°, either by etching the reticle or by placing a phase-shifting material in the regions of the features. That is, the APSM comprises a layer of leaky chrome covering the entire reticle base, except for the features, which are open regions (i.e regions having no thin chrome layer) with appropriate phase-shifting. Since the radiation transmitted through the features is phase-shifted 180° relative to radiation transmitted through the leaky chrome layer, the prior art phase-shifters are not required. The portion of the reticle outside of the features having the attenuating chrome layer will be referred to as the "field" of the reticle herein. Since the leaky chrome transmits only about 10% of the exposing radiation, regions away from the features are only partially exposed. This partial exposure removes some of the photoresist from these regions, but a continuous layer remains. The photoresist layer thickness is adjusted for this exposure. For example, if the photoresist layer underneath the leaky chrome is reduced in thickness 1,000 Å due to the exposure, and a 10,000 Å layer of photoresist after developing is desired, an initial photoresist layer of 11,0000 Å will be used. The leaky chrome layer is also referred to as an "absorptive phase-shifter" and as a "halftone chrome layer."

Several problems occur in the manufacture feature of the prior art APSM. First, it is extremely difficult to deposit a thin layer of chrome with uniform thickness across the surface of the reticle. Typically, some regions will have a thickness greater than the target thickness and some regions will have a thickness less than the target thickness. Second, it is difficult to deposit this thin layer with uniform physical characteristics across the surface of the reticle. For example, some regions will have more residual gas (e.g., nitrogen) incorporated in the film than other regions. Because of this and other factors, physical properties such as the optional density and refractive index are not uniform. Finally, as is well know, the thin chrome layer will have a much higher pin hole density than the prior art opaque chrome layer. In addition to the above-described difficulties in depositing the thin chrome layer, it is difficult to maintain the quality of the deposited layer throughout the reticle manufacturing process. Since the layer is so thin, it is not as rigorous as the prior art opaque chrome layer. For example, during the various manufacturing steps, such as cleaning, the above-described non-uniformities and defects may become worse. These difficulties in producing and maintaining a high quality thin chrome layer limit the ability of the prior art APSM to achieve good lithographic performance, for the reasons described below.

One problem caused by the non-uniform thickness and refractive index of the thin chrome layer in the APSM is a varying "focal shift," which will be explained in reference to FIGS. 1A and 1B. In the following FIGS. 1A and 1B, a graphical representation of defocus versus critical dimension is shown. It will be understood that the actual values can vary considerably based upon the feature being formed, exposure parameters, including time and energy of the exposure, printer parameters and other factors. The FIGS. 1A and 1B provide an example for one set of exposure and printer parameters. Referring to FIG. 1A, a graph of critical dimension (CD) in a photoresist layer plotted against defocus (distance between photoresist layer and best or perfect focus) is shown. As can be seen from curve 10 of FIG. 1A, if the image is defocused in either the positive or negative direction, the dimension of an opening in the resist decreases. If the process specification allows for a CD in the range of 0.3–0.5 microns, then for the example shown in FIG. 1A, the defocus can be in the range of approximately −0.75$\mu$ through +0.75$\mu$, since the CD varies from about 0.3$\mu$ at −0.75 defocus, to 0.4$\mu$ at 0$\mu$ defocus, and back down to 0.3$\mu$ at +0.75$\mu$ defocus. Outside of this range, the CD falls below 0.3$\mu$ and is outside of the specified range. The range between −0.75$\mu$ and +0.75$\mu$ is the depth of field (DOF), and is shown by the line 11. Thus, so long as the photoresist layer is within this DOF, the CD will be within specification. As is well known, a large DOF is desirable, as the wafer topography and other factors cause the level of the photoresist layer to vary considerably across the exposure field of the printer.

In a phase-shifted reticle, the above-mentioned focal shift occurs, whereby curve 10 shifts as the phase difference between the phase-shifter and the feature varies from 180° (phase error). If the phase difference is less than 180°, the curve 10 shifts to the right. If the phase difference is greater than 180°, the curve 10 shifts to the left. Referring to FIG. 1B, curve 12 shows a plot of CD versus defocus for a feature where the phase difference between the feature and its phase-shifter is less than 180°, and curve 13 shows CD versus defocus for a feature where the phase difference between the feature and its phase-shifter is greater than 180°. Note that the shape of an individual curve does not change significantly due to phase error. Rather, the curve simply shifts, the direction and amount of shift determined by the direction and amount of phase error from 180°.

As mentioned earlier, the prior art thin chrome layer accounts for approximately 30° of the phase-shift. However, this value will vary as the thickness and refractive index of the film varies. Since, as described above, the thickness and refractive index of the thin chrome layer are non-uniform, the phase-shift will be non-uniform across the surface of the reticle. Because of the varying phase-shift of the thin chrome layer, there will be regions on the prior art APSM where the phase difference is less than 180° between a feature and its phase-shifter and regions where the phase difference is greater than 180°. That is, the prior art APSM will typically have both negative and positive phase error. If the prior art APSM has some features where the phase difference is, for example, 170°, and some features where the phase difference is, for example, 190°, the DOF will be greatly decreased due to the focal shift. As can be seen from FIG. 1B, for those features having a phase difference less than 180° (curve 12), the CD will be below 0.3$\mu$ if the defocus is approximately 0.5$\mu$ or greater, while those features having a phase difference greater than 180° (curve 13) will have a CD below 0.3$\mu$ if the defocus is approximately −0.5$\mu$ or less. Thus, DOF 14 now extends only from −0.51$\mu$ through +0.5$\mu$ due to the varying phase error. This compares to DOF 11 of −0.75$\mu$ through +0.75$\mu$ for a reticle with no phase error, or uniform phase error.

A problem caused by the non-uniform thickness and optical density of the thin chrome layer in the prior art APSM is that light transmission through the layer will not be uniform. This may cause excessive removal of photoresist in some areas. Additionally, if the transmittance near features is too low, there may be insufficient phase-shifted radiation to effectively minimize diffraction, thereby causing a loss in resolution.

Finally, the increased pin hole density of the prior art APSM will cause undesired openings to be created in a photoresist layer exposed by the APSM. If the openings occur in critical regions, the APSM will be unusable.

What is needed is an attenuated phase-shifted reticle which allows for use of phase-shifting to improve resolution, which can be used on all features and closely spaced features, which has only minor or relatively uniform phase error, which has a low defect density, and which is easily manufacturable using current technology.

SUMMARY OF THE INVENTION

An attenuated phase-shifted reticle is disclosed. In a preferred embodiment, features are phase-shifted approximately 180° relative to the attenuated field of the reticle. The field of the reticle has a sub-resolution pattern formed thereon, which transmits a reduced portion of radiation. The pattern is sub-resolution, so that no pattern is formed in the photosensitive layer under the sub-resolution patterns. Rather, the photosensitive layer is uniformly and only partially exposed under the field. Since the radiation transmitted through the field is 180° out of phase to the radiation transmitted through the features, the improved resolution of a phase-shifted reticle is achieved. Since prior art phase-shifters are not required, all types of features and closely spaced features may be fabricated with the reticle of the present invention. The reticle of the present invention is easily manufactured since the sub-resolution pattern is formed in a layer having a thickness equal to that of a conventional opaque layer. Therefore, the pin hole density is no worse than that of a conventional reticle. Additionally, the sub-resolution pattern is as rigorous as a conventional pattern and can therefore stand up to all standard reticle fabrication steps.

Other features and advantages of the present invention will be made apparent from the detailed description which follows.

DETAILED DESCRIPTION OF PRESENT INVENTION

Figure 1A:
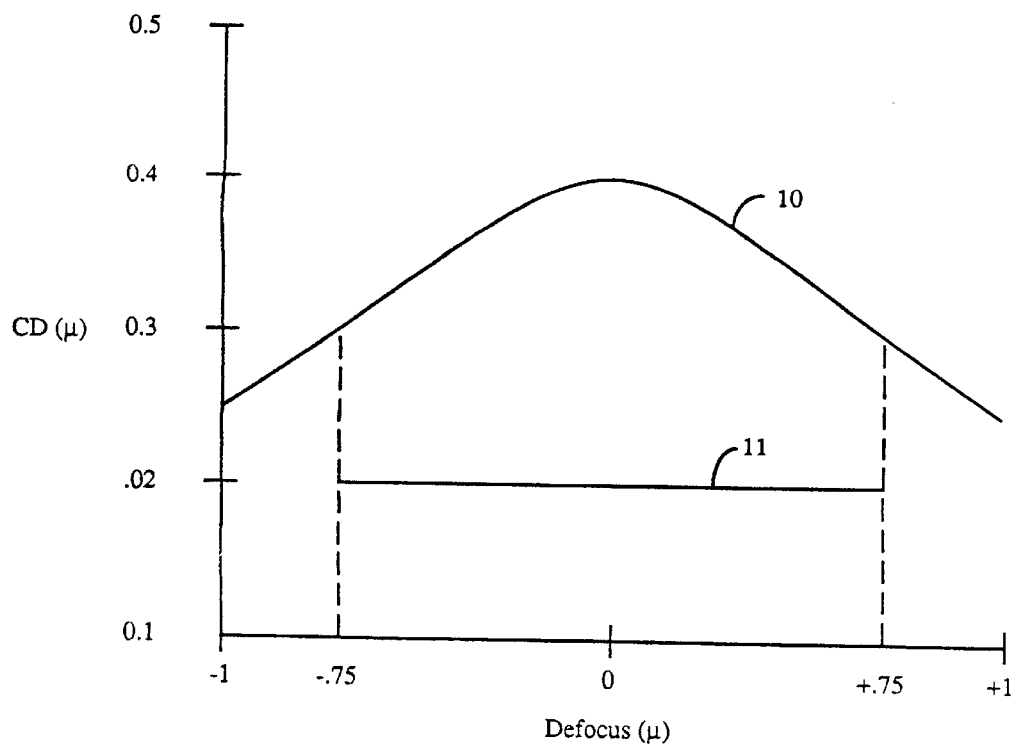
FIGS. 1A and 1B show a graphical representation of defocus versus critical dimension.
Figure 1B:
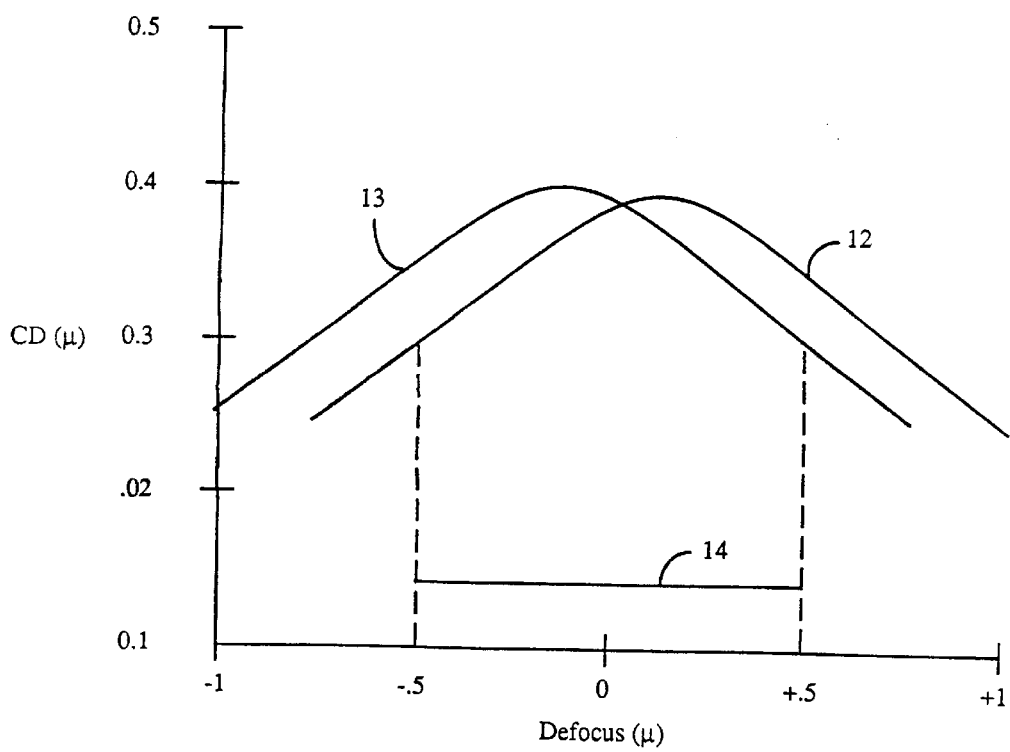

An attenuated phase-shifted reticle is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

A variety of patterned resist layers may be formed. The present invention may be used to pattern a resist layer having dimensions larger or smaller than the conventional resolution limit. The patterned resist layer may be used as a masking layer during a dielectric, silicon, or metal etch step, or as a masking layer during a doping step or at other processing steps. A large number of patterns can be formed using the present invention. A patterned resist layer may be used for defining contact or via openings, polysilicon word lines, metal lines, field isolation regions, ion implanted regions, etc. Patterns that can be formed by the present invention are not limited to the examples given. The present invention may be used with any semiconductor technology including bipolar, metal-oxide-semiconductor, and III–V semiconductors.

A variety of materials and equipment can be used. Although the present invention is described in conjunction with a positive photoresist, it will readily be appreciated that the present invention may be practiced using any type of photosensitive layer, including positive photoresist, negative photoresist, contrast enhanced photoresist, and resist materials that are patterned using radiation having a wavelength outside of the visible light spectrum. Other materials, such as an anti-reflective coating, for example, may be used with a resist layer. The reticle may be made of many different materials. A reticle base or substrate may comprise quartz, glass, silicon, silicon nitride, silicon oxynitride, or boron nitride. Chrome, gold, copper, and other metallic compounds may be used for an opaque element. A polysilicon stencil or "see through" reticle may be used, although the reticle may be more difficult to manufacture. Any material that is opaque to the radiation may be used as an opaque element. In the embodiments described herein, the reticle base is made of quartz and the opaque regions comprise a patterned chrome layer of sufficient thickness to block substantially all radiation. In a preferred embodiment, phase-shifting is accomplished through use of regions of different quartz thicknesses as described below. Alternatively, phase-shifting may be accomplished by forming regions of other materials in the reticle region where phase-shifting is desired. For example, phase-shifting may be accomplished by placing a material including photoresist, silicon dioxide (doped or undoped), spin-on-glass, polyimide, silicon nitride, silicon oxynitride, and poly (methyl methacrylate) in the appropriate region.

The present invention may be used with any lithographic printer regardless of radiation wavelength and numerical aperture. Examples of lithographic printers include projection printers, contact printers, and proximity printers. Commercially available lithographic printers typically operate at a wavelength X no longer than approximately 436 nm and have a lens with a numerical aperture (NA) in the range of approximately 0.17 through 0.6 and an image reduction factor in the range of approximately 1×1 through 10×1.

In a currently preferred embodiment of the present invention, a semiconductor substrate is coated with a positive photoresist layer and is placed in a lithographic printer. In a currently preferred embodiment, the lithographic printer is a projection printer, such as a Nikon i-line projection printer, having a radiation source that emits radiation having a wavelength of approximately 365 nm, a lens with a numerical aperture of approximately 0.50 and an image reduction factor of approximately 5×1. The 5×1 image reduction factor means that an image on the reticle is reduced by about five times when the image reaches the surface of the photoresist layer. For simplicity, features and patterns on the reticle will be described based on the size of the formed image, taking into account the IRF of the printer. For example, when the radiation intensity at the photoresist surface is discussed in relation to a reticle feature or sub-resolution pattern, reference will be made to, for example, the intensity of radiation "under an opening" of the reticle. This terminology is used to describe the intensity of radiation on the photoresist surface at the corresponding ⅕ size image. Thus, all dimensions described herein are on a 1:1 basis unless noted otherwise. To determine the corresponding size of the feature or patterns on the reticle, the 1:1 size should be multiplied by approximately 5. Additionally, it has been found that to make a feature of a given size in positive photoresist, the size of the feature on the reticle should be approximately 20% larger than the desired feature size times the IRF of the printer for the attenuated phase-shifted reticle of the present invention.

Figure 2:
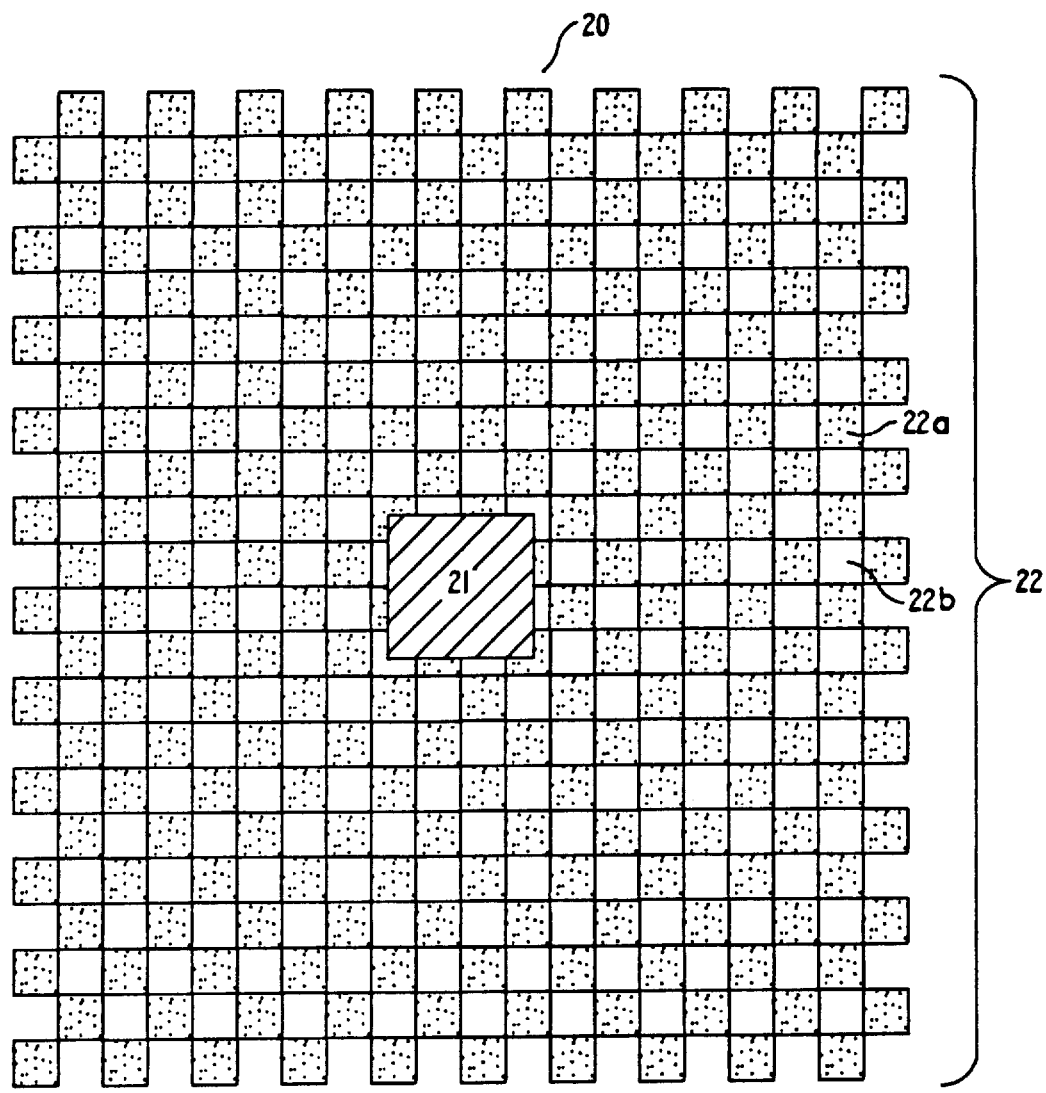
FIG. 2 shows a portion of a reticle according to the present invention having an opening surrounded by a subresolution pattern.

Referring to FIG. 2, a plan view of a currently preferred embodiment of a portion of reticle 20 of the present invention is shown. Opening 21 is the pattern to be formed in the photoresist layer. Opening 21 could be, for example, used to form a contact or via opening pattern in the photoresist layer. In a preferred embodiment, opening 21 is approximately square, with a dimension of approximately 20% larger than the desired opening in the photoresist layer. For example, if a dimension of 0.4μ in the photoresist layer is desired, opening 21 would have a dimension of approximately 0.5μ on a 1:1 basis. It will readily be appreciated that the present invention may be used to fabricate an opening or any other feature, such as those described earlier, with a larger or smaller dimension. Pattern 22, which is herein referred to as a checkerboard pattern, surrounds opening 21 as shown. In a currently preferred embodiment, reticle 20 comprises a quartz base, and pattern 22 is formed in a chrome layer disposed on the quartz base.

In the region of opening 21, (as well as in the regions of other features on reticle 20 not shown in FIG. 2), transmitted radiation is phase-shifted in the range of approximately 160°–200° (+n*360° where n is an integer of 0 or greater) compared with other regions of the reticle. In a currently preferred embodiment, this is accomplished by removing a thickness of the quartz base of reticle 20 sufficient to phase-shift radiation transmitted through opening 21 in the range of approximately 160°–200° compared with radiation transmitted through the quartz base of reticle 20 in the region of pattern 22.

In FIG. 2, regions 22a are regions where chrome is present. The light regions, shown as 22b, indicate regions where no chrome is present. Unlike the prior art APSM, the chrome layer in regions 22a of pattern 22 is completely opaque to radiation. In a currently preferred embodiment, the chrome layer is approximately 1,100 Å thick. The chrome or opaque layer that forms regions 22a of pattern 22 can be a different thickness, but it should be thick enough to prevent transmission of substantially all radiation incident upon it.

In general, any openings in the sub-resolution pattern, such as regions 22b of FIG. 2, as well as similar regions of other embodiments of the present invention, should be no more than approximately 0.3λ/NA, and are preferably approximately 0.2λ/NA or less. In a currently preferred embodiment, each of the regions 22a and 22b are approximately square, with a dimension of approximately 0.1μ on a side. Pattern 22 (comprising regions 22a and 22b) is thus well below the resolution of the printer described previously. Because it is below the resolution of the printer, pattern 22 will not be replicated in the photoresist layer. Instead, a relatively uniform pattern of radiation will reach the photoresist surface underneath pattern 22. The intensity of the radiation below the sub-resolution pattern will depend upon the density of the pattern (i.e, ratio of open area to total area of the pattern, e.g. 22b/(22a+22b)). The intensity under the pattern will be less than this ratio times the radiation incident on the reticle, due to optical effects, including scattering and diffraction. Thus, for example, if in pattern 22 the regions 22a and 22b are equal in size, the resulting intensity underneath pattern 22 will be less than 50%, and typically about 30%, of the radiation incident on reticle 20. The intensity can be decreased by decreasing the ratio of opening to total area in the sub-resolution pattern. For example, in pattern 22, the pattern could be modified by replacing some of the open regions 22b with opaque regions 22a. Additionally, several alternative patterns or modifications thereof, as described below, can be utilized to achieve the desired radiation intensity underneath the sub-resolution patterns.

As described above, opening 21 shifts radiation approximately 160°–200° out of phase compared with the radiation transmitted through reticle 20 in the region of pattern 22. Therefore, the portion of pattern 22 surrounding opening 21 effectively acts as a phase-shifter, minimizing the effects of diffraction and thereby improving the resolution of the process.

Figure 3:
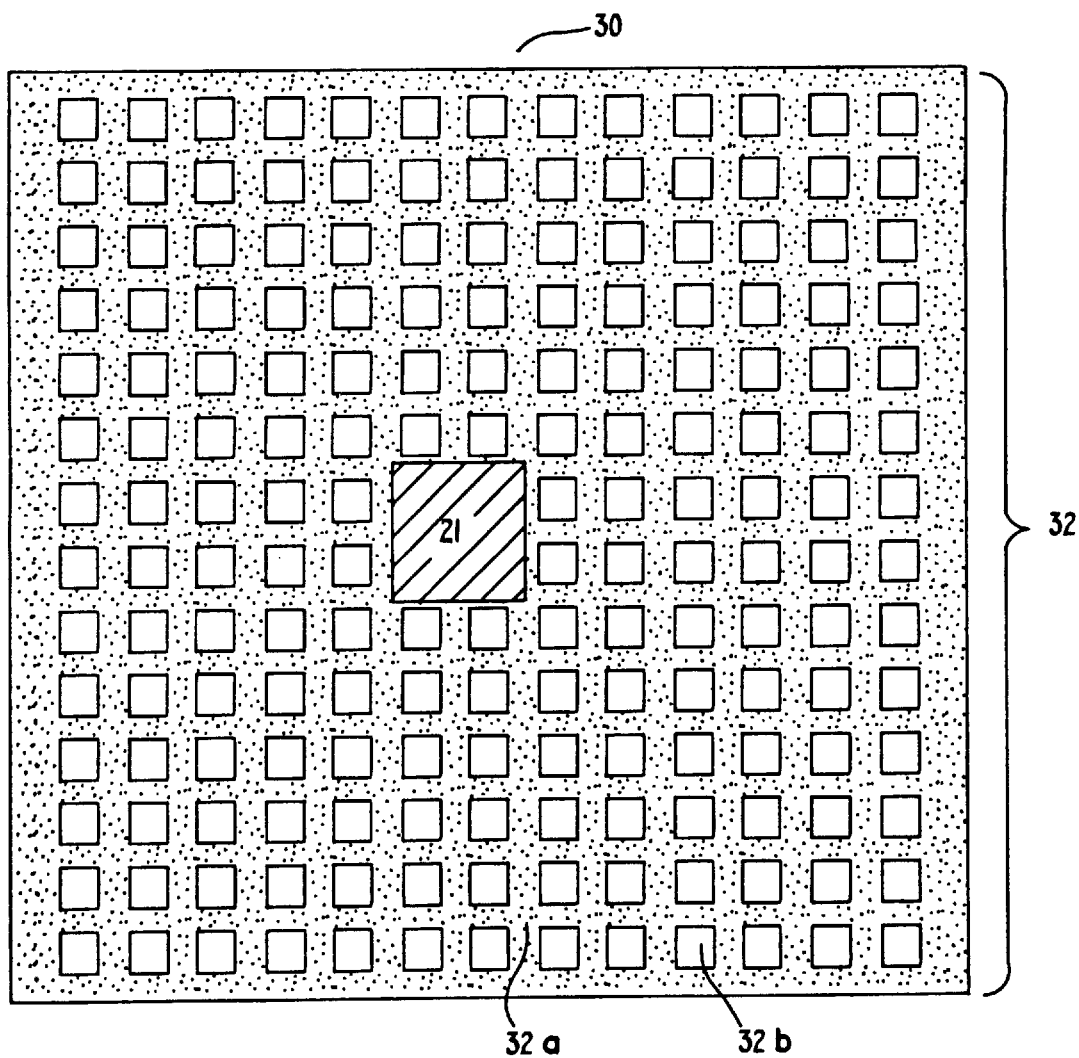
FIG. 3 shows a portion of a reticle according to the present invention having an opening surrounded by a further sub-resolution pattern.
Figure 4:
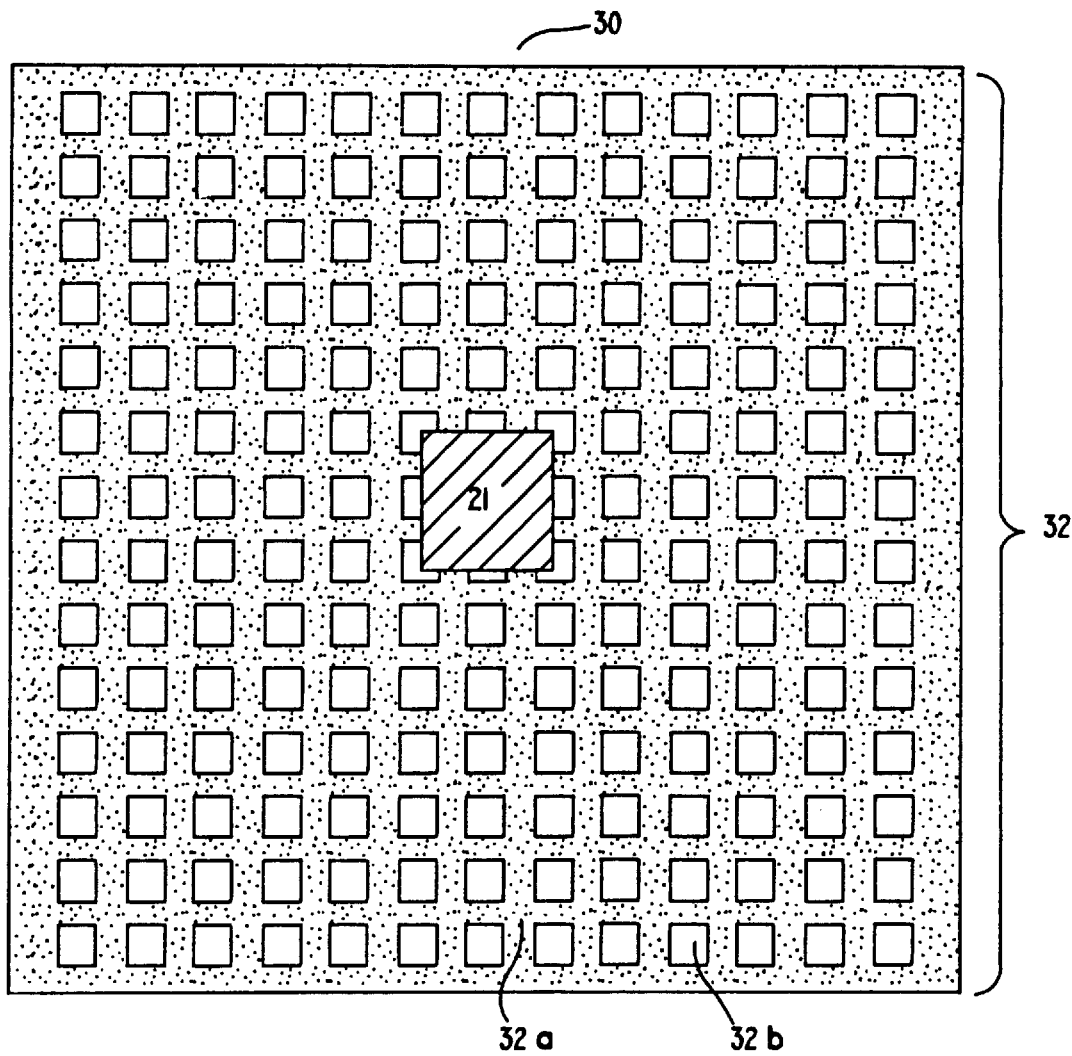
FIG. 4 shows a portion of a reticle having an opening surrounded by the subresolution pattern shown in FIG. 3, the opening disposed at a second position with respect to the subresolution pattern.

FIG. 3 shows a further embodiment of the present invention. In FIG. 3, a portion of reticle 30 again having opening 21 is shown. As in the previous embodiment, opening 21 has a sufficient thickness of the quartz base of reticle 30 etched to phase-shift radiation 160°–200° relative to radiation transmitted through unetched portions of reticle 30. Pattern 32, which surrounds opening 21 is herein referred to as a grid pattern. Similar to pattern 22 of FIG. 2, regions 32a represent regions where substantially opaque chrome is present and the light regions 32b represent openings in the chrome layer. In a currently preferred embodiment, each of regions 32b is approximately square, having a dimension of approximately 0.2μ or less. The width of chrome regions 32a can be in the range of approximately 0.1μ–0.5μ. As described previously, the dimensions of regions 32a and 32b can be varied in order to achieve a desired intensity beneath pattern 32. Pattern 32 of FIG. 3 is also below the resolution of, for example, the printer described previously. Pattern 32 therefore transmits a uniform, attenuated field of radiation approximately 160°–200° out of phase compared to that transmitted through opening 21, and thus acts as a phase-shifter for the opening 21, allowing for improved resolution. Note that the edges of opening 21 lie along portions of chrome regions 32a. As can be seen from the embodiment shown in FIG. 4, however, this is not necessary as the opening 21 shown in FIG. 4 is located in a different position relative to chrome regions 32a than opening 21 of FIG. 3.

Figure 5:
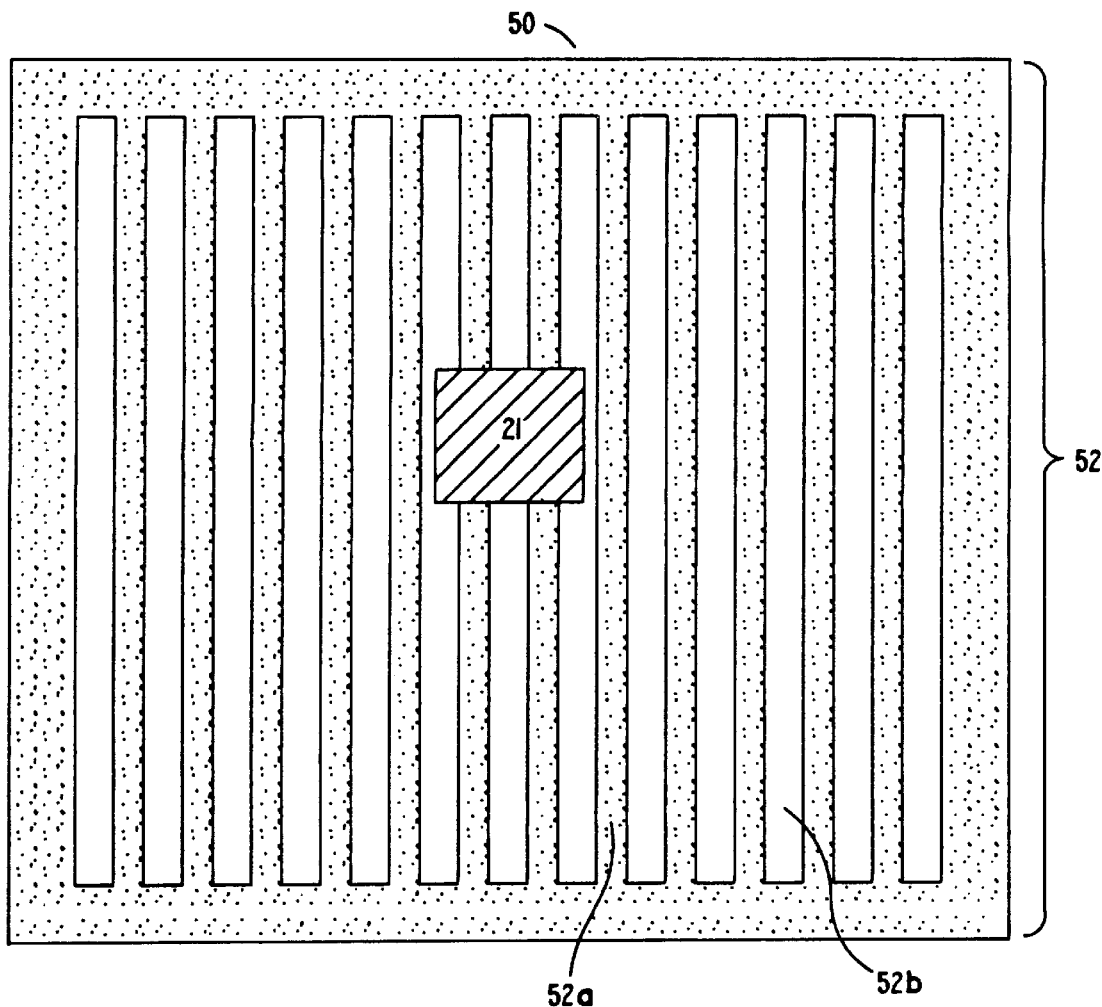
FIG. 5 shows a portion of a reticle according to the present invention surrounded by a further subresolution pattern.

FIG. 5 shows a further embodiment of the present invention. In FIG. 5, a portion of reticle 50 again with opening pattern 21 is shown. As with the previous embodiment, radiation transmitted through opening pattern 21 is shifted in the range of approximately 160°–200° relative to radiation transmitted through other portions of reticle 50. Pattern 52 of FIG. 5 is herein referred to as a grating pattern. In a currently preferred embodiment, opaque regions 52a have a width in the range of approximately 0.1–0.5μ. Opaque regions 52a are spaced at a distance in the range of approximately 0.05–0.2μ. This spacing, of course, is the width of openings 52b of pattern 52. Again, these dimensions can be varied to achieve a desired transmitted intensity so long as the pattern remains sub resolution. As with the previous embodiments, the portion of pattern 52 surrounding opening 21 acts as a phase-shifter, thereby improving the resolution.

Figure 6:
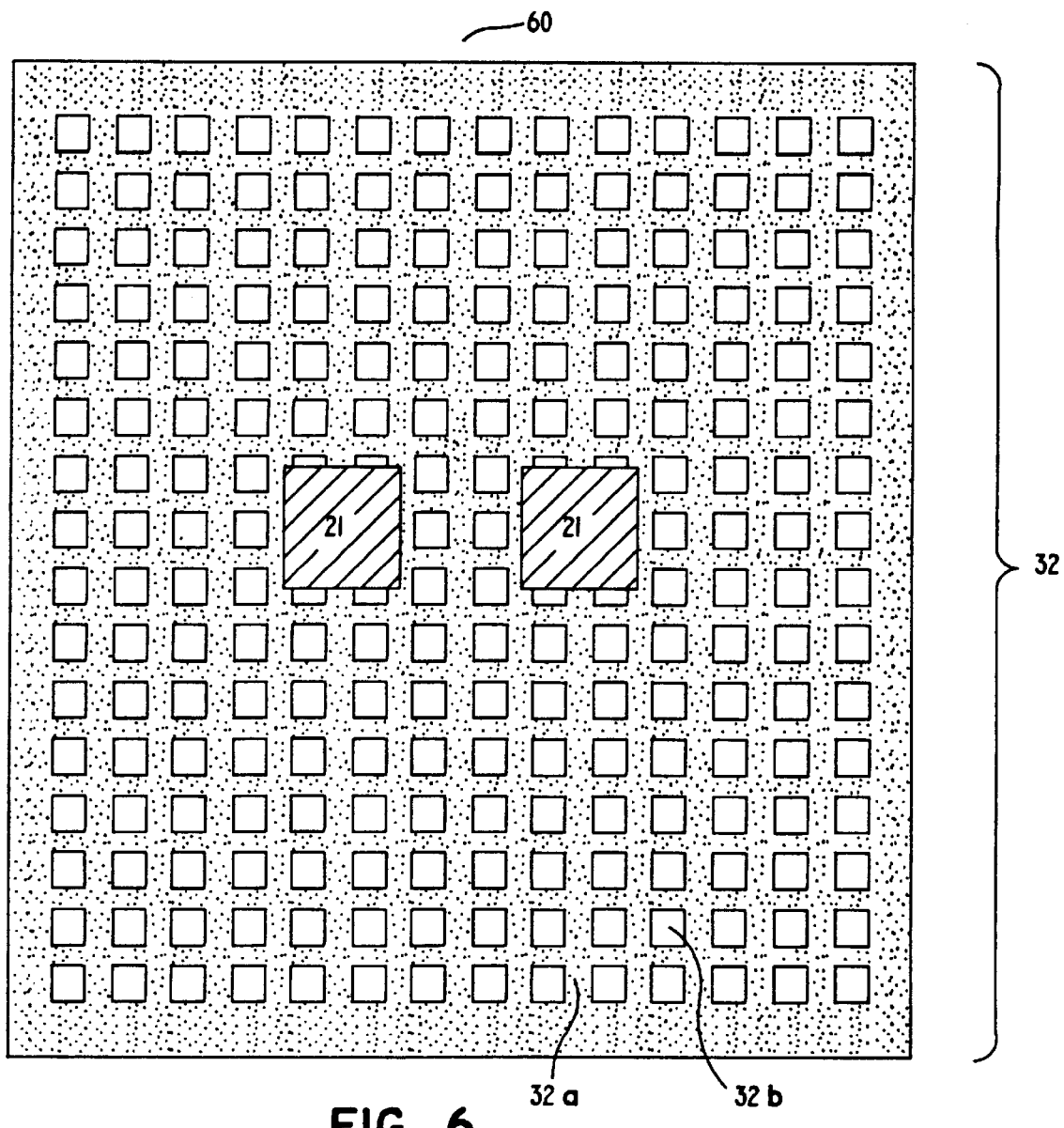
FIG. 6 shows a portion of a reticle according to the present invention with two closely spaced openings surrounded by a subresolution pattern.

FIG. 6 shows an embodiment of the invention with two closely spaced opening patterns 21 on reticle 60. In the embodiment shown in FIG. 6, the two opening patterns 21 are spaced at a distance of approximately 0.5μ. Pattern 32 has been shown surrounding opening pattern 21 in FIG. 6 for illustration. It will be obvious that any of the patterns disclosed herein, including pattern 22 of FIG. 2, pattern 52 of FIG. 5, as well as all other patterns within the scope of the present invention could be used to form two closely spaced features such as openings 21. Note that openings 21 can be placed much more closely together with the sub-resolution patterns of the present invention. In the prior art, each of the prior art features would require a phase-shifting element which would shift the phase of the radiation approximately 180° relative to the prior art feature. The width of the phase-shifting element would depend upon the particular exposure parameters used as well as the desired resolution improvement. However, if two features with prior art phase-shifting elements were spaced as closely as opening patterns 21 of FIG. 6, they would suffer from the proximity effect described earlier, with the resist between the two opening patterns becoming exposed. In general, the prior art phase-shifting elements such as phase-shifting rims for contact openings must be separated by approximately 0.55*λ/NA. Since the phase-shifting elements must be separated by this distance, the prior art features themselves must be separated by a minimum of 0.55*λ/NA plus two times the width of the phase-shifting element (since, as stated above, each prior art feature is surrounded by a phase-shifting element). In the present invention, since phase-shifting is accomplished without the use of prior art phase-shifting elements, two proximate features such as two openings 21 can be spaced more closely together while avoiding the proximity effect. Therefore, the present invention provides for phase-shifted features (such as contact openings) to be placed more closely together than prior art phase-shifted features.

Figure 7:
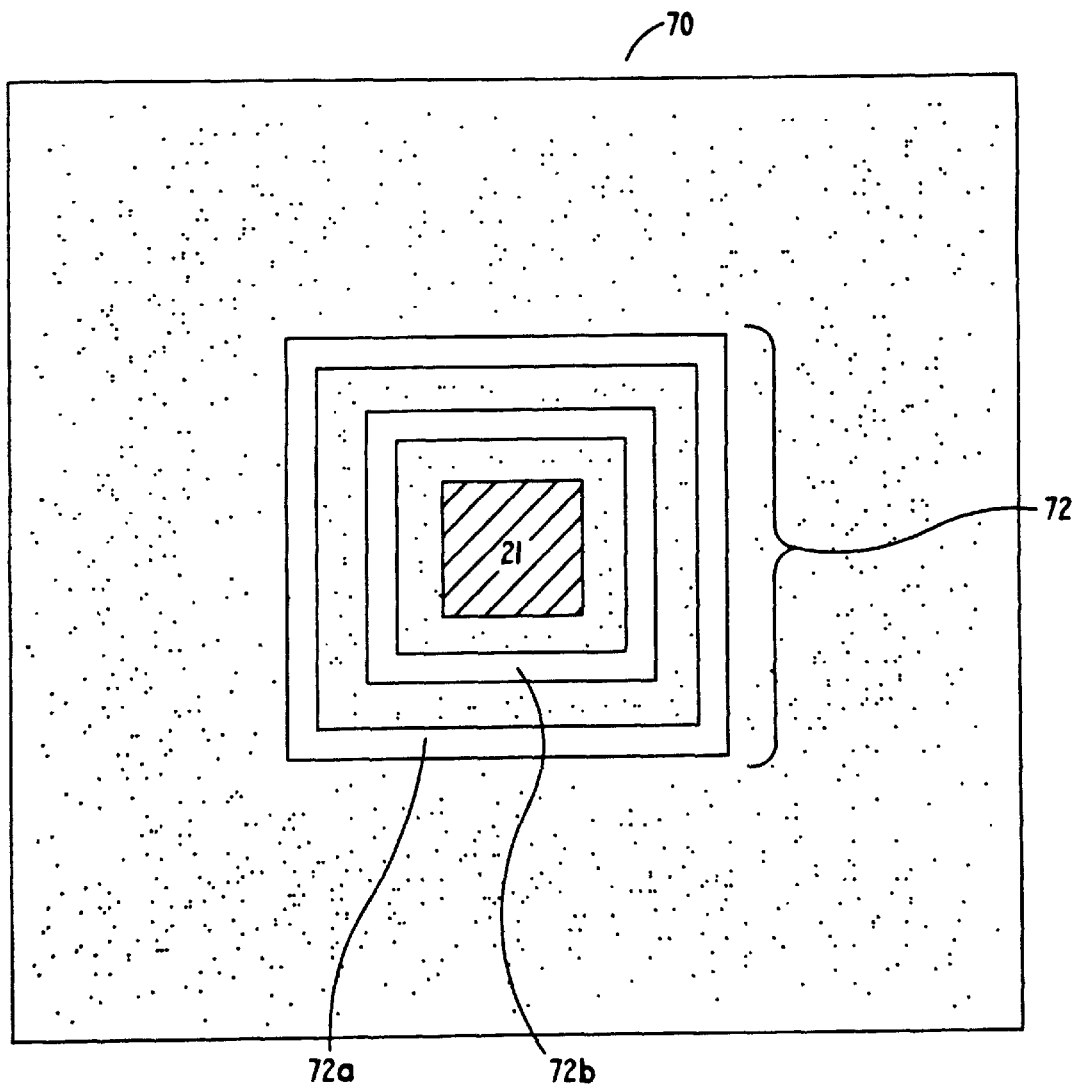
FIG. 7 shows a portion of a reticle according to the present invention having an opening surrounding a further subresolution pattern which is present only in regions near the opening.

In the present invention, it is not necessary that the entire reticle have a sub-resolution pattern, rather, the sub-resolution pattern can be placed only around the features to be formed. FIG. 7 shows opening pattern 21 surrounded by a sub-resolution pattern 72 herein referred to as a concentric frame pattern. As can be seen from FIG. 7, the pattern 72 is present only in the region surrounding opening pattern 21. Pattern 72 is similar to the grating pattern 52 of FIG. 5. Opaque regions 72a and openings 72b of pattern 72 have dimensions in the same range as those of opaque regions 52a and openings 52b of pattern 52. Alternately, any of patterns 22, 32, 52, or any other pattern within the scope of the present invention could be used in place of pattern 72 and be placed only around the features if desired.

As will be appreciated, the present invention is not limited to the specific patterns described herein. In general, any pattern which is below the resolution of the printer, which results in a relatively uniform exposure of intensity at the photoresist surface, and which transmits approximately 5–30% and preferably approximately 10% of the incident radiation will effectively act as an attenuating phase-shifted pattern. In this regard, it will be readily appreciated that, for example, in pattern 21, the opaque regions 22a and open regions 22b do not necessarily need to be square, and do not necessarily need to be the same size as one another as shown. Similarly, the relative width and spacing of the opaque and open regions in the other patterns described above can be varied so long as the pattern is sub-resolution, and results in a relatively uniform, attenuated exposure for the printer and exposure parameters being used. Additionally, patterns other than those shown, including, for example, rounded or irregularly shaped openings, could be used.

A further advantageous aspect of the present invention is that it can be used to form any pattern where phase-shifting is desired, without special considerations for forming phase-shifting elements as with prior art phase-shifters, and without the problems of manufacturably producing the attenuated, leaky chrome layer of prior art attenuated phase-shifted masks. Thus, in the present invention, there does not exist the prior art problem with APSMs of controlling transmitted radiation intensity and phase-shift simultaneously, or the problem of focal shift due to phase error, described earlier. Another advantage of the present invention is that a high quality, low defect reticle can be produced by conventional methods, since the present invention uses, in a preferred embodiment, a conventional chrome layer to produce the sub-resolution pattern of the present invention. Additionally, the quality of the invented reticle is easy to maintain since the chrome layer used to form the sub-resolution patterns is much more rigorous than the leaky chrome of the prior art APSM. Therefore, a reticle of the present invention will stand up to standard processing, including reticle cleaning steps. Finally, since the sub-resolution pattern of the present invention does not suffer from the non-uniform thickness or optical density of the prior art APSM, a uniform attenuated exposure is obtained. For these reasons, the reticle of the present invention achieves and maintains optimum lithographic performance.

To produce reticles using the present invention, a reticle blank having any one of the sub-resolution patterns within the scope of the invention is provided. As described in relation to FIGS. 3 and 4, the features to be formed can be placed at any position in the attenuating pattern. Thus, the manufacturer of the reticle blank does not need to take into account the particular pattern to be formed. The features can be placed on the reticle blank having the sub-resolution pattern with one masking step. Typically, the reticle blank having the sub-resolution pattern of the present invention is first covered with a photoresist layer. Next, the reticle blank is exposed in an E-beam system with the device pattern. After developing the photoresist, a chrome etch is first performed, to define the features (i.e., remove the sub-resolution pattern from regions such as opening pattern 21 of FIGS. 2–7), followed by a quartz etch, which etches a sufficient thickness of quartz to phase-shift radiation transmitted through the features in the range of approximately 160°–200° relative to radiation transmitted through the regions of the reticle having the sub-resolution pattern. It should be noted that formation of the sub-resolution pattern on the reticle does not present a difficulty as the E-beam systems used to fabricate reticles generally have a much better resolution than the lithographic printers used to fabricate devices with the reticle. More importantly, the reticles are typically used with a printer having an IRF of approximately 5:1, for example, so that the sub-resolution pattern is larger on the reticle than the corresponding image at the photoresist surface, and is therefore easily within the resolution of the process used to produce the reticle.

As a further alternative, the quartz in the regions of the features could remain unetched, while the quartz in the regions of the sub-resolution pattern surrounding the features could he etched, to provide for phase-shifting. This alternative, however, would require two masking steps.

Thus an attenuated phase-shifted reticle has been described. The reticle of the present invention does not require a difficult to manufacture leaky chrome layer. Furthermore, the present invention eliminates or minimizes the focal shift problem due to phase error of a non-uniform thin chrome layer. The invented reticle is easy to manufacture and maintain and can be used for any type of pattern. With the reticle of the present invention, optimum lithographic performance can be achieved and maintained. Reticle blanks having the sub-resolution pattern of the present invention can be provided to be used to fabricate reticles for any layer of any device.

I claim:

1. A reticle blank for use in fabricating a reticle to pattern a radiation sensitive layer in a lithographic printer, said reticle blank having a region comprising a pattern of features, said features having a size that is below the resolution of said printer, wherein said region transmits a reduced portion of radiation incident thereon, said reduced portion of radiation being relatively uniform underneath said pattern; and wherein said pattern of features comprises radiation transmitting regions and opaque regions both said radiation transmitting regions and said opaque regions having a dimension below the resolution of said printer.

2. The reticle blank as described in claim 1 wherein said pattern is selected from the group consisting of a checkerboard pattern, a grid pattern, a grating pattern, and a concentric frame pattern.

3. The reticle blank as described in claim 1 wherein said reduced portion of radiation transmitted through said region is in the range of approximately 5%–30% of radiation incident on said region.

4. The reticle blank as described in claim 2 wherein said reduced portion of radiation transmitted through said region is in the range of approximately 5%–30% of radiation incident on said region.

5. The reticle blank as described in claim 2 wherein said features have a dimension on a 1:1 basis of less than approximately 0.20 microns.

6. The reticle blank as described in claim 4 wherein said features have a dimension on a 1:1 basis of less than approximately 0.20 microns.

7. The reticle blank as described in claim 2 wherein said pattern of features comprises radiation transmitting regions and opaque regions, both said radiation transmitting regions and said opaque regions having a dimension below the resolution of said printer.

8. The reticle blank as described in claim 3 wherein said pattern of features comprises radiation transmitting regions and opaque regions, both said radiation transmitting regions and said opaque regions having a dimension below the resolution of said printer.

9. A reticle for use in patterning a radiation sensitive layer in a lithographic printer comprising:

a first region, said first region transmitting a substantial portion of radiation incident thereon;

a second region proximate said first region, said second region comprising a pattern of features, said features having a size that is below the resolution of said printer, wherein said second region transmits a reduced portion of radiation incident thereon;

phase-shifting means, wherein radiation transmitted through said first region is phase-shifted approximately 160–200 degrees relative to radiation transmitted through said second region; and wherein said pattern of features comprises radiation transmitting regions and opaque regions both said radiation transmitting regions and said opaque regions having a dimension below the resolution of said printer.

10. The reticle as described in claim 9 wherein said a pattern is selected from the group consisting of a checkerboard pattern, a grid pattern, a grating pattern, and a concentric frame pattern.

11. The reticle as described in claim 9 wherein said reduced portion of radiation transmitted through said second region is in the range of approximately 5%–30% of radiation incident on said second region.

12. The reticle as described in claim 10 wherein said reduced portion of radiation transmitted through said second region is in the range of approximately 5%–30% of radiation incident on said second region.

13. The reticle as described in claim 10 wherein said features have a dimension on a 1:1 basis of less than approximately 0.20 microns.

14. The reticle as described in claim 12 wherein said features have a dimension on a 1:1 basis of less than approximately 0.20 microns.

15. The reticle as described in claim 9 wherein said reticle comprises a base, wherein said pattern is formed in an opaque layer disposed on said base, and wherein said phase-shifting means comprise a difference in thickness of said base between said first region and said second region.

16. The reticle as described in claim 10 wherein said reticle comprises a base, wherein said pattern is formed in an opaque layer disposed on said base, and wherein said phase-shifting means comprise a difference in thickness of said base between said first region and said second region.

17. The reticle as described in claim 11 wherein said reticle comprises a base, wherein said pattern is formed in an opaque layer disposed on said base, and wherein said phase-shifting means comprise a difference in thickness of said base between said first region and said second region.

18. The reticle as described in claim 12 wherein said reticle comprises a base, wherein said pattern is formed in an opaque layer disposed on said base, and wherein said phase-shifting means comprise a difference in thickness of said base between said first region and said second region.

19. The reticle as described in claim 13 wherein said reticle comprises a base, wherein said pattern is formed in an opaque layer disposed on said base, and wherein said phase-shifting means comprise a difference in thickness of said base between said first region and said second region.

20. The reticle as described in claim 14 wherein said reticle comprises a base, wherein said pattern is formed in an opaque layer disposed on said base, and wherein said phase-shifting means comprise a difference in thickness of said base between said first region and said second region.

21. The reticle as described in claim 10 wherein said pattern of features comprises radiation transmitting regions and opaque regions, both said radiation transmitting regions and said opaque regions having a dimension below the resolution of said printer.

22. The reticle as described in claim 11 wherein said pattern of features comprises radiation transmitting regions and opaque regions, both said radiation transmitting regions and said opaque regions having a dimension below the resolution of said printer.

23. The reticle as described in claim 15 wherein said pattern of features comprises radiation transmitting regions and opaque regions, both said radiation transmitting regions and said opaque regions having a dimension below the resolution of said printer.

24. A reticle blank for use in fabricating a reticle to pattern a radiation sensitive layer in a lithographic printer, said reticle blank having a region comprising a pattern of features, said features having a size that is below the resolution of said printer, wherein said region transmits a reduced portion of radiation incident thereon, wherein said pattern of features comprises radiation transmitting regions and opaque regions, both said radiation transmitting regions and said opaque regions having a dimension below the resolution of said printer.

25. The reticle blank as described in claim 24 wherein said pattern is selected from the group consisting of a checkerboard pattern, a grid pattern, a grating pattern, and a concentric frame pattern.

26. The reticle blank as described in claim 24 wherein said reduced portion of radiation transmitted through said region is in the range of approximately 5%–30% of radiation incident on said region.

27. The reticle blank as described in claim 25 wherein said reduced portion of radiation transmitted through said region is in the range of approximately 5%–30% of radiation incident on said region.

28. The reticle blank as described in claim 25 wherein said features have a dimension on a 1:1 basis of less than approximately 0.20 microns.

29. The reticle blank as described in claim 27 wherein said features have a dimension on a 1:1 basis of less than approximately 0.20 microns.

* * * * *

UNITED STATES PATENT AND TRADEMARK OFFICE
CERTIFICATE OF CORRECTION

| | |
|---|---|
| PATENT NO. | : 5,881,125 |
| APPLICATION NO. | : 07/952061 |
| DATED | : March 9, 1999 |
| INVENTOR(S) | : Dao |

It is certified that error appears in the above-identified patent and that said Letters Patent is hereby corrected as shown below:

In column 1, at line 51, delete "K" and insert --$\lambda$--.

In column 2, at line 38, delete "11,0000" and insert --11,000--.

In column 5, at line 64, delete "X" and insert --$\lambda$--.

Signed and Sealed this

Seventeenth Day of July, 2007

JON W. DUDAS
*Director of the United States Patent and Trademark Office*